(12) United States Patent
Fukunaga

(10) Patent No.: US 9,391,194 B1
(45) Date of Patent: Jul. 12, 2016

(54) HIGH VOLTAGE VERTICAL FPMOS FETS

(71) Applicant: SANKEN ELECTRIC CO., LTD., Niiza-Shi, Saitama (JP)

(72) Inventor: Shunsuke Fukunaga, Saitama (JO)

(73) Assignee: SANKEN ELECTRIC CO., LTD., Niiza-shi (JP)

( * ) Notice: Subject to any disclaimer, the term of this patent is extended or adjusted under 35 U.S.C. 154(b) by 0 days.

(21) Appl. No.: 14/744,183

(22) Filed: Jun. 19, 2015

(51) Int. Cl.
| H01L 29/00 | (2006.01) |
| H01L 29/78 | (2006.01) |
| H01L 29/40 | (2006.01) |
| H01L 29/423 | (2006.01) |
| H01L 29/10 | (2006.01) |
| H01L 29/417 | (2006.01) |
| H01L 29/36 | (2006.01) |
| H01L 29/06 | (2006.01) |

(52) U.S. Cl.
CPC ........ H01L 29/7813 (2013.01); H01L 29/0661 (2013.01); H01L 29/0696 (2013.01); H01L 29/1095 (2013.01); H01L 29/36 (2013.01); H01L 29/404 (2013.01); H01L 29/407 (2013.01); H01L 29/41758 (2013.01); H01L 29/41766 (2013.01); H01L 29/41775 (2013.01); H01L 29/4236 (2013.01)

(58) Field of Classification Search
CPC ............ H01L 29/7813; H01L 29/7825; H01L 29/41758; H01L 29/404; H01L 29/407; H01L 29/4236; H01L 29/1095; H01L 29/41775; H01L 29/36; H01L 29/0661; H01L 29/0696
USPC ....................................................... 257/330
See application file for complete search history.

(56) References Cited

U.S. PATENT DOCUMENTS

| 4,914,058 | A | 4/1990 | Blanchard |
| 5,998,833 | A | 12/1999 | Baliga |
| 6,690,062 | B2 | 2/2004 | Henninger et al. |
| 7,557,409 | B2 | 7/2009 | Pattanayak et al. |
| 2007/0138547 | A1* | 6/2007 | Nakamura ........ H01L 29/66719 257/331 |
| 2008/0230787 | A1* | 9/2008 | Suzuki ................ H01L 29/0623 257/77 |
| 2009/0278200 | A1* | 11/2009 | Takeda ............ H01L 21/823412 257/337 |
| 2010/0163975 | A1* | 7/2010 | Hshieh ................ H01L 29/1095 257/330 |
| 2012/0061754 | A1* | 3/2012 | Hsieh .................. H01L 29/0634 257/331 |
| 2016/0093728 | A1* | 3/2016 | Decker ............... H01L 29/7813 257/330 |

FOREIGN PATENT DOCUMENTS

JP 2013-069852 A 4/2013

* cited by examiner

Primary Examiner — Marc Armand
Assistant Examiner — Quovaunda V Jefferson
(74) Attorney, Agent, or Firm — Mots Law, PLLC

(57) ABSTRACT

Semiconductor power devices such as vertical FPMOS are described preferably having a plurality of trenches formed at a top portion of a semiconductor substrate extending laterally across the semiconductor substrate along a longitudinal direction. Each trench has sidewalls generally perpendicular to a longitudinal direction of the trench and extending downward from a top surface to a trench bottom. Gate electrodes and source electrodes are positioned in the trenches with controlled spacing between their surfaces to achieve increased capacitance between them at increasing depth from the top surface. This provides higher frequency performance at higher power levels while improving tolerance to higher voltage.

20 Claims, 5 Drawing Sheets

HIGH VOLTAGE VERTICAL FPMOS FETS

FIELD OF THE INVENTION

The disclosure relates generally to semiconductor power device structures. Particular embodiments relate to vertical FPMOS (Field plate metal-oxide-semiconductor) structures that can withstand higher voltage.

BACKGROUND

Conventional technologies for reducing power semiconductor device gate to drain capacitance while increasing voltage resistance and current are still plagued with technical limitations. Because of growing demands for high frequency switch power devices, an urgent need exists to resolve these technical difficulties and limitations. For power transistors including MOSFET and IGBT (insulated-gate bipolar transistor), a new device configuration and manufacturing process are necessary to reduce the speed-limiting capacitance between the gate and the drain of these switching power devices.

Gate to drain capacitance, $C_{gd}$ degrades switching performance of MOSFETs. Various techniques have been proposed for reducing $C_{gd}$. One proposal, described in U.S. Pat. No. 7,557,409, uses a super trench MOSFET, wherein a source electrode is buried in the lower portion of the trench to reduce the gate-to-drain capacitance, improving the ability of the MOSFET to operate at high frequencies. The trench buried source electrode is insulated from the epitaxial layer and semiconductor substrate but is in electrical contact with the source region. The substrate advantageously includes a plurality of annular trenches separated by annular mesas and a gate metal layer that extends outward from a central region in a plurality of gate metal legs.

Another proposal has been to increase the thickness of the gate oxide layer at the bottom of the trench, as suggested in U.S. Pat. No. 4,914,058 to Blanchard. In Blanchard, the MOSFET as an N-channel device is formed in an epitaxial (epi) layer that is grown on an N+ substrate. A trench extends through the epi layer and into N+ substrate. The epi layer is generally doped with an N-type impurity such as phosphorus. The epi layer also includes an N+ source region and a P body, both of which are contacted by a metal layer. The background N-type doping of the epi layer is found in an N-drift region. The N+ substrate and the N-drift region represent the drain of the Blanchard MOSFET.

The sidewalls of the trench are lined with a gate oxide layer, and trench is filled with a gate electrode, which is typically made of polycrystalline silicon. (polysilicon) that is doped heavily to make it conductive. A thin gate oxide was grown on the walls and floor of trench. Noteworthy is that the Blanchard MOSFET has sidewalls that are lined but not independent structures such as gates. At the bottom of the trench is a thick oxide layer that serves to reduce the capacitance between the polysilicon gate and the drain (the N+ substrate and the N-drift region).

Baliga discloses in U.S. Pat. No. 5,998,833, and in particular FIG. 3, a DMOS (double-diffused metal-oxide-semiconductor) cell as an example of conventional art. Baliga's disclosure shows use of a source electrode 128a underneath the trenched gate 127 to reduce the gate-to-drain capacitance. Both source electrode 128a and trenched gate 127 are in the trench defined by side walls 120a. The gate of the DMOS cell is divided into two segments. The gate-to-drain capacitance is reduced because contributions to capacitance from the gate-drain overlapping areas are eliminated.

Another example of conventional art is shown as FIG. 1 in U.S. Pat. No. 6,690,062. This reference teaches an improvement in the switching behavior of a trenched MOS power transistor by providing a shielding electrode 17 in an edge region 4. The shielding electrode surrounds at least sections of an active cell array 2. Gate electrodes 10 are configured in trenches 9. There is a capacitance between an edge metallization gate structure 20 and a drain zone 16. The shielding electrode 17 located in the edge region 4 reduces the capacitance between an edge gate structure and a drain zone 16 and hence reduces the gate-drain capacitance of the transistor.

The above described transistor configurations still have a common difficulty. The source electrode disposed on the trench bottom is connected to the source voltage through an edge area of the semiconductor power device. This inevitably increases the source electrode resistance. Furthermore, the extra masks needed to create such connection also increase the cost of manufacturing. More importantly, decreasing the capacitance between gate and source to achieve higher switching speed leads to poor voltage resistance at high current because the rate of change in current becomes steep during the switching process.

Therefore, a need still exists in the art of power semiconductor device design and manufacture to provide a new manufacturing method and device configuration in forming the power devices such that the above discussed problems and limitations can be resolved.

An electronic device includes a drift region having a first conductivity type and a gate including a plurality of doped regions formed in the drift region and having a second conductivity type. The doped regions have a dopant concentration greater than $2.2 \times 10^{19}$ cm$^{-3}$ A vertical SiC-MOSFET formed in this way is expected to be utilized as a switching device having low ON-resistance and switchable at high speed in power conversion equipment such as an inverter for motor control and an uninterruptible power supply (UPS). However, when high voltage is applied between a source and a drain, the high voltage is applied not only to an active region through which current flows during on-time but also to an edge termination structure region that is disposed in a peripheral portion of the active region and that sustains the breakdown voltage. When high voltage is applied, the edge termination structure region has a depletion layer spreading in a lateral direction (a direction parallel to a substrate principal plane) and is, therefore, susceptible to electrical charge of the substrate surface. As a result, breakdown characteristics become unstable.

Another complicated proposed solution presented by Nobuyuki et al. in JP2013-069852A "Semiconductor Device" is to build the source electrode deep in the trench, but add extra insulation lining the trench near the trench top, between the source and the base. See FIG. 1. This figure shows parallel-arranged trenches 10 with centrally positioned source electrodes 20 with gates 30 arranged near the channel tops between source 20 and base P regions (labelled "P"). A higher breakdown voltage is achieved by making the hatched insulation layer thicker in region 50.

In particular, this teaches increased insulation thickness between gate and source than between gate and the inside wall semiconductor. However, such structure is sensitive to overvoltage at high frequency switching. This disclosure continues the general teaching in this field to add structures, such as thicker insulation regions, to the trenches and in their peripheries. In particular, However, such added complexity is undesirable and generally increases space usage, and conflicts with the need for increased current capacity. In particular, peripheral trenches taught as a solution undesirably add cost and require space.

SUMMARY

Embodiments provide a semiconductor power device disposed in a semiconductor substrate, comprising trenches having defined widths formed at defined intervals perpendicular to and across a top portion of the semiconductor substrate extending laterally across the substrate and extending into an epitaxial layer; base regions located outside the trenches; long trench source electrodes inside the trenches; and shorter gate electrodes inside the trenches positioned between the trench source electrodes and the base regions and generally parallel to the trench source electrodes, with an effective capacitance along their length from top region near the surface to bottom region towards the trench bottom, wherein the distance between the trench source electrode surfaces and the gate electrode surfaces is larger at the top region than that at the bottom region. In an embodiment the distance between the trench source electrode surfaces and the gate electrode surfaces decreases from the top region to the bottom region respectively. In an embodiment the trench gate electrodes are angled in towards the trench center with increasing depth in the trench. In an embodiment the trench source electrode is thicker at a deeper region below the gate electrodes.

In an embodiment the thicker region of the source electrode start at a depth that is below the gate electrode by a distance equal to at least half of the gate electrode thickness. In yet another embodiment the thickness of the trench source electrode parallel to the gate electrodes increases with increasing depth in the trench region at the location of the gate electrodes. In yet another embodiment the thickness of the trench source electrode parallel to the gate electrodes increases with increasing depth in the trench region at the location of the gate electrodes and the gate electrode surfaces protrude closer to the center of the trench with increasing depth in the trench.

In an embodiment the base dopant concentration is between 5×10E16 to 5×10E17 per cubic centimeter. In an embodiment the epitaxial layer has a dopant concentration of between 1.2E16 to 1.8E16 N− per cubic centimeter.

In an embodiment the semiconductor power device lacks a peripheral trench structure. In an embodiment the trench source electrodes are centered in the trenches, and extend at least mostly to the bottom of the trenches. In an embodiment the gate electrodes are between the trench source electrodes and the trench walls, and extend only partially into the trenches adjacent the base regions. In an embodiment the base regions are at the top of the epitaxial layer and extend down as far as the gate electrodes. In an embodiment the trench widths are approximately 1.5 microns. In an embodiment the spacing between trenches is approximately 1.7 microns. In an embodiment the semiconductor power device has depletion regions along the trenches that expand uniformly with applied voltage.

Another embodiment provides a vertical FPMOS having high voltage resistance without peripheral trench structure, comprising a semiconductor substrate with an epitaxial layer, parallel trenches of defined widths at defined intervals across a top portion of the semiconductor substrate extending laterally across the substrate and extending into the epitaxial layer wherein the defined trench widths and the defined intervals between trenches are at a ratio of 1.0 to 2.5 respectively, base regions located outside and near the tops of the trenches, source electrodes inside the trenches, and gate electrodes inside the trenches positioned between the source electrodes and the base regions, wherein the location and doping of base and epitaxial regions are arranged to provide uniform expansion of the depletion layer, thereby providing high voltage resistance, and wherein the trench source electrode and trench gate electrode surfaces are positioned closer to each other at increasing depth in the trench.

In a preferred embodiment the trench source electrodes are centered in the trenches, and extend at least mostly to the bottom of the trenches. In another preferred embodiment the gate electrodes are between the trench source electrodes and the trench walls, and extend only partially into the trenches adjacent the base regions. In an embodiment the base regions are at the top of the epitaxial layer and extend down as far as the gate electrodes. In an embodiment the trench widths are approximately 1.5 microns. The term "approximately" as used here means within +/−25% of the value. In another embodiment the trench widths are between 1.35 and 1.65 microns. In a desirable embodiment the spacing between trenches is approximately 1.7 microns. The term "approximately" as used here means within +/−25% of the value. In a desirable embodiment the spacing between trenches is between 1.5 and 1.9 microns. In an embodiment the power device develops depletion regions along the trenches that expand uniformly with applied voltage. In an embodiment uniform depletion regions develop with application of applied voltage between 50 and 150 volts.

DETAILED DESCRIPTION

Figure 2:
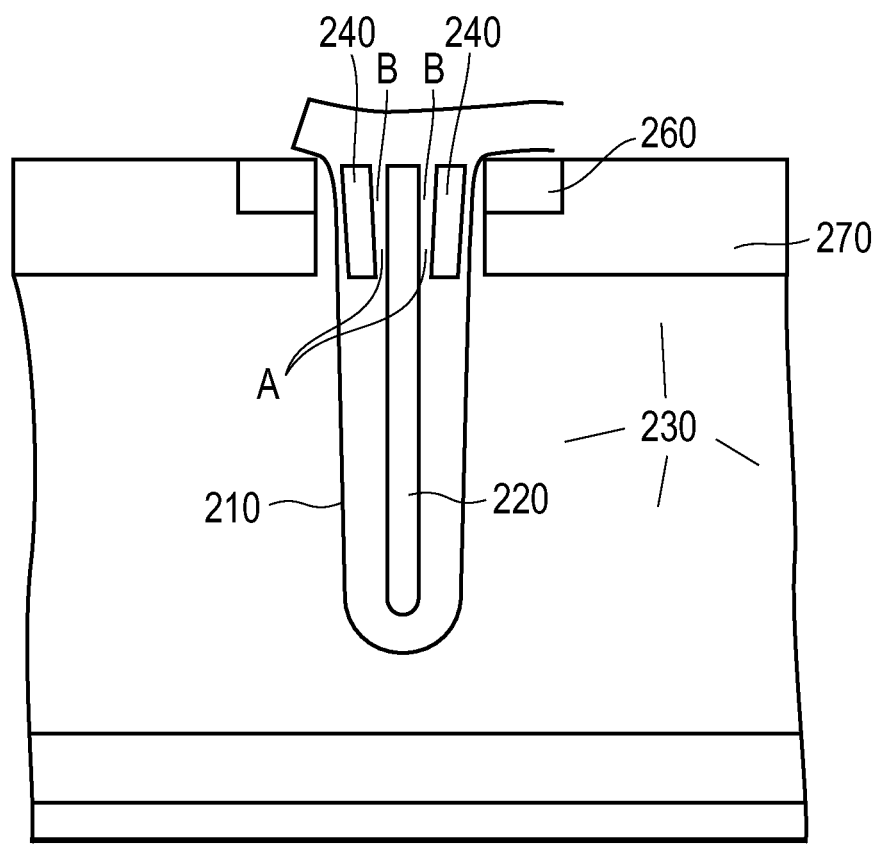
FIG. 2 is an embodiment of a trenched MOSFET.
Figure 3:
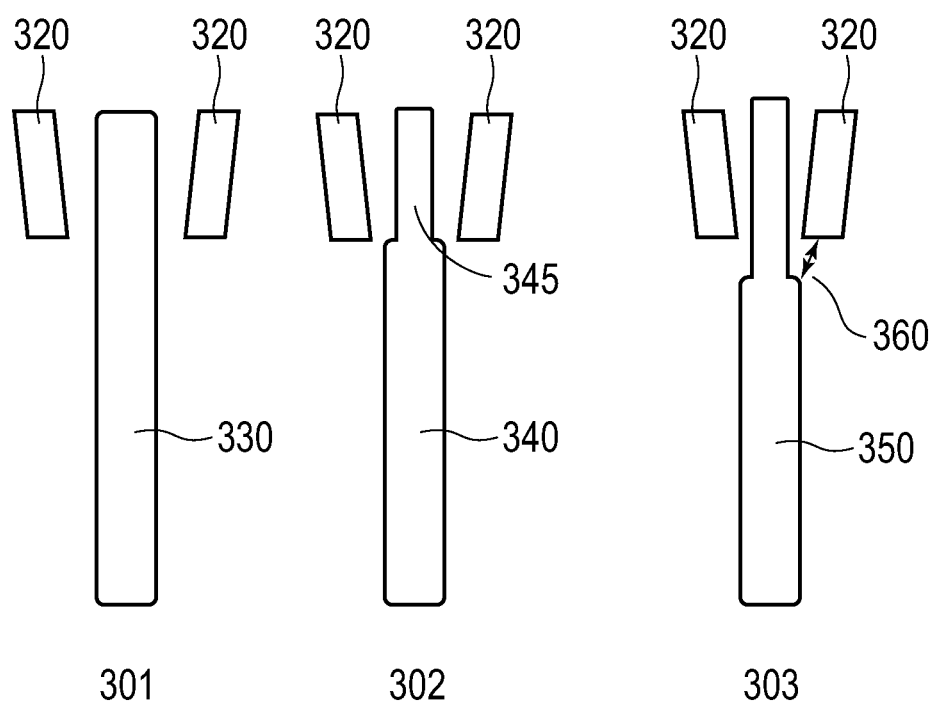
FIG. 3 shows embodiments with alternative trench source and gate electrode configurations.
Figure 4:
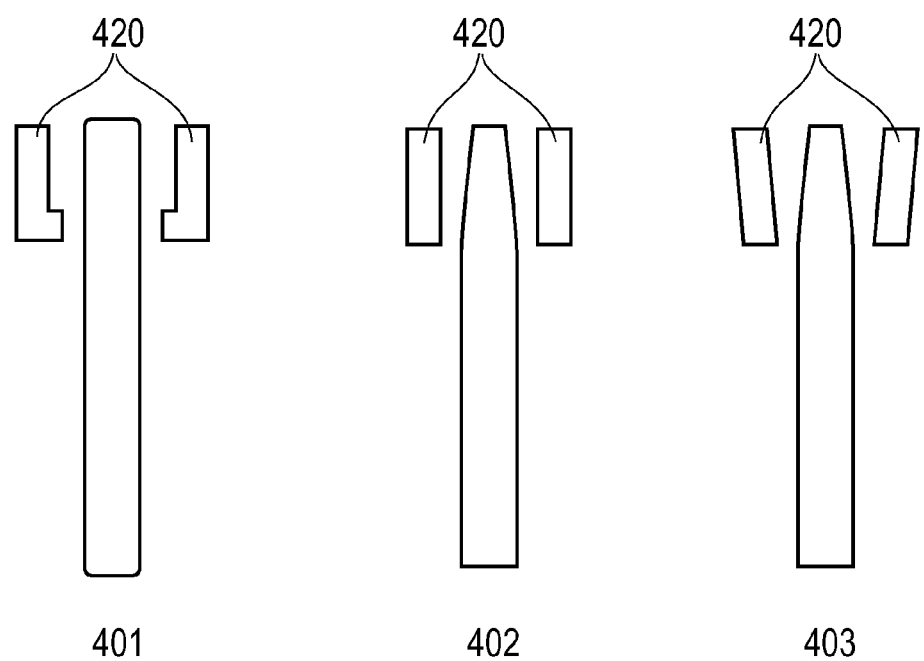
FIG. 4 shows embodiments with alternative trench source and gate electrode configurations.

Embodiments successfully address the problem of high speed switching while minimizing steep current flow during switching for an improved breakdown voltage resistance via an unusual structure as shown in FIGS. 2-4. This structure unexpectedly provided both high switching speed while improving tolerance to higher voltage.

Preferred embodiments generally are understood with reference to FIG. 2. FIG. 2 shows a representative cross section of a trench 210 having a long vertical (as seen here) trench source electrode within a substrate 230. Near the top of the trench arranged at or on the trench side walls are gate electrodes 240. The space between the gate electrodes and the trench source electrode (space B at the top and space A near the bottom) is filled with insulator, which may have dielectric properties. Capacitance occurs within this space by virtue of the surface of trench source electrode 220 being close to the surface of gate electrode(s) 240. In a most preferred embodiment, the spacing (as capacitance) at the upper half portion B of this space is lower than the spacing (and capacitance) at the lower half portion A of this space. Outside the trench at the upper region of this important control region is N+ region 260. Below this is P region 270.

Capacitance Generally

An important performance criterion is the capacitance between the gate and drain ($C_{gd}$), which determines the MOSFET's ability to switch current quickly and operate at high frequencies. In a standard trench-gated MOSFET, the gate-to-drain capacitance is measured across the gate oxide layer at the bottom of the trench, which separates the gate electrode from the drain. In the trench-gated MOSFET of embodiments described here this gate to drain capacitance is minimized.

The rate at which the power MOSFET structure can be switched ON and OFF is determined by the rate at which the input capacitance can be charged and discharged. The capacitance between the drain and gate electrodes plays an important role in computing the drain current and the voltage changes during switching. The thickness of the gate oxide and the trench width are two factors that have a primary effect on the input capacitance of a MOSFET in embodiments.

In embodiments, the input capacitance for a power MOSFET structure with the source electrode in the trench is larger than that for the structure with the gate electrode in the entire trench region. The input capacitance is due to the gate electrode overlap with the P-base and N+ source regions on the trench sidewall.

In embodiments, when the source electrode is embedded in a trench, another capacitance to deal with is that due to overlap of the source metal electrode and the overlap of the gate electrode with the source electrode embedded in the trench. A specific gate (or input) capacitance for a power MOSFET structure with the source embedded in the trench can be calculated using known equations. The total capacitance is a function of the thickness of the gate oxide and inter-electrode oxide, and the oxide between the gate and source electrodes within the trench. The gate-drain capacitance with the gate electrode in the entire trench region is determined by summing the capacitance contributed along the trench sidewalls and the capacitance at the trench bottom.

Adjust Insulation Spacing Between Trench Source and Gate for Varying Capacitance in the Control Region The trench in an embodiment, generally is filled with insulator material. Desirable embodiments achieve improved high voltage resistance with high current capability by adjustment of insulation thickness between trench source electrode and gate electrodes which are not exactly parallel to the source electrode and within the same trench.

In a most desirable embodiment the insulated distance between the top of a gate electrode and the trench source electrode is larger than the insulated distance between the bottom of the gate electrode and the trench source electrode. In an embodiment the dielectric constant of the insulation material increases at the lower region to achieve increased capacitance. In an embodiment the insulation thickness is constant but the dielectric constant of the deposited insulation layer increases with depth away from the top surface. In an embodiment the insulation layer includes at least a portion of a group III oxide with a higher dielectric constant than silicon dioxide. In an embodiment the lower portion includes at least some silicon oxynitride for increased dielectric constant and increased capacitance.

FIG. 2 shows gate electrode 240 lower surface closer to trench source electrode 220 at lower region A than at upper region B. This provides greater capacitance at the lower region and more importantly, was found to provide a less steep rate of change in current during switching, thus improving the device tolerance to voltage. A variety of structures are contemplated to achieve the greater capacitance at the lower region, as exemplified in FIGS. 3 and 4. FIG. 3 shows structure 301 having gates 320 (trench side walls and other components not shown for clarity) arranged with a gradually tapering distance towards the trench source electrode, to achieve greater capacitance with depth (distance from top surface) between the gate and source electrodes. The trench source electrode is straight in this embodiment. Structure 302 has gates 320 located opposite to a thinner top region 345 of trench source electrode 340. Structure 302 has gates 320 located further from a thicker region of trench source electrode 340, for a more homogeneous depletion region during operation. In an embodiment distance 360 is about (i.e. within +/−25% of) half the thickness of 320. In another embodiment distance 360 is more than half the thickness of 320. In another embodiment distance 360 is about equal to the thickness of 320.

FIG. 4 shows additional embodiments for achieving variable capacitance between trench source electrode and trench gate electrode with increasing distance from the top surface. The gate electrodes 420 in device 401 have a discontinuous increase in width at their lower portions for increased capacitance there. The gate electrodes 420 in device 402 are straight but the trench source electrode is discontinuous or, (as shown here) continuously increases with depth to achieve greater capacitance with depth via a decreased spacing between source and gate surfaces. Both the gate electrodes and the trench source electrode in device 403 become closer to achieve greater capacitance with depth.

In an embodiment, capacitance is further increased by depositing an insulation material having greater dielectric constant at a lower region between gate and source trench electrodes compared to that of an upper region. This provides greater capacitance at the lower level. In an embodiment the space between trench and source electrode and gate electrode is constant from top to bottom but increased capacitance at the bottom region is achieved by increasing dielectric constant of insulation material deposited at the lower level(s).

Without wishing to be bound by any one theory for how embodiments of the invention operate, it is believed that the device is more resistant to overvoltage by varying capacitance between gate and source electrodes within the region where gate and source electrodes are positioned in the trench. More specifically, the insulation film is thinner at the lower portion of this region, thus providing greater capacitance there. It is thought that the rate of current flow change during switching, which increases with increased insulation spacing is alleviated by this non-parallel structure. If the switching is too fast, di/dt increases and the device becomes vulnerable to overvoltage. But the structure taught herein allows for less di/dt at high switching speeds. Structures discovered as described here provide greater capacitance at the bottom of this region while minimizing capacitance near the top. This helps protect from overvoltage, and provides a MOS having fast switching together with higher voltage resistance.

Additional Embodiments for Combination

In an embodiment, this insulation adjustment is further combined with at least one combination with trench width, spacing between trenches and/or careful selection of dopant levels. This surprisingly provided a structure that avoids or minimizes further peripheral trench structures or more complicated dopant regions as otherwise championed by others in this art. Desirably, MOS trenches are placed in such a way so as to couple the depletion region widths of the trenches, to one another evenly. This forms a structure that is able to withstand voltages up to the maximum value supported by the underlying epitaxial layer.

The generation of the depletion layer is a characteristic of all MOS structures. Here the nature of each depletion region, and thus the means of coupling of depletion region widths together, depends on both the applied voltage across the MOS system and the semiconductor dopant concentration. In an embodiment, the spacing between the trenches is a key factor in depletion region width coupling. Accordingly, the spacing of trenches and the width of the trenches are significant dimensions that led to the reduced capacitance, higher switching speed and other benefits in additional embodiments that may be combined.

Basic Trench Structure

With reference to FIG. 2, trenches preferably are formed in the body (base) layer and the epitaxial layer of the substrate. In an embodiment, each trench is lined with a dielectric or an insulator. In a preferred embodiment the trench is lined with silicon dioxide.

Figure 1:
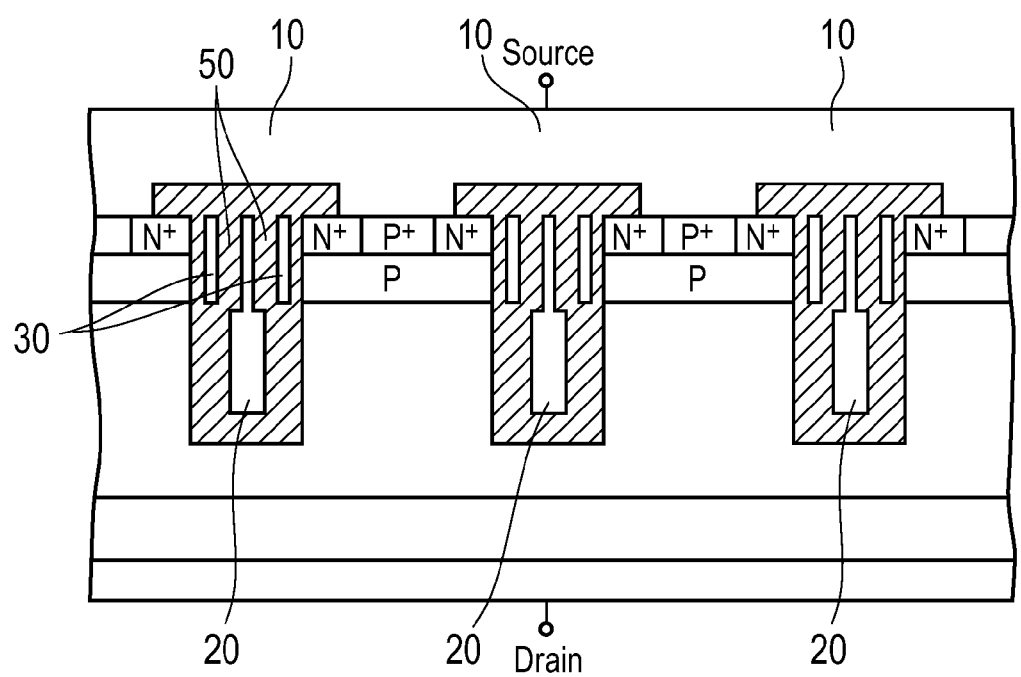
FIG. 1 is a prior art trenched MOSFET structure.

The trenched gate and source structures of FIGS. 2-4 can be seen in context with the more complete trench structure shown in FIG. 1. A drain electrode 1 typically is on the bottom surface of the substrate. Above drain electrode "Drain" is the N+ layer (also called the N+ substrate), above which is the N− layer (N epitaxial layer or epi layer) and above that is the P− layer, which is the body or base region. N+ region, a source region, is formed within base region.

Figure 5:
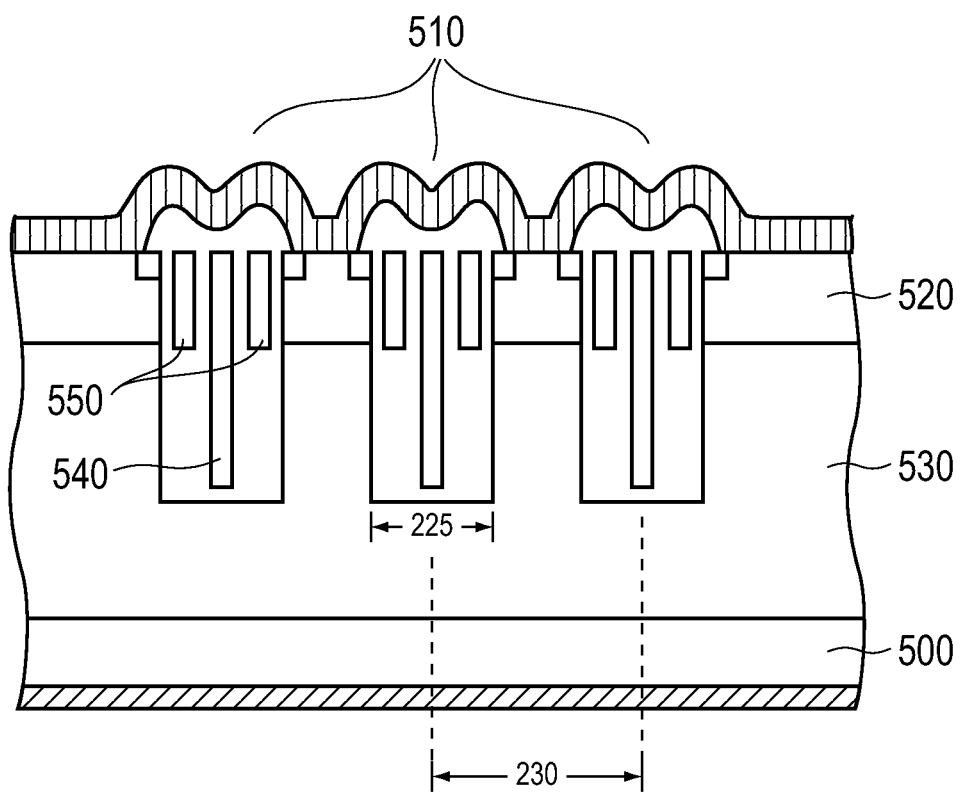
FIG. 5 shows an embodiment of a multiple trench structure.

FIG. 5 shows three trenches 510 formed through the base region 520 and into N− layer 530. Each trench has a trench source electrode 540, also known as a sealed electrode. On each side of trench source electrode 540 is a gate electrode 550. In an embodiment, the length Lg of both gates in each trench is approximately the depth of the base region 520. In an embodiment Lg is at least 10 percent longer than base region 520. In an embodiment Lg is at least 25 percent longer than base region 520. In an embodiment Lg is up to 10 percent shorter than base region 520. In an embodiment Lg is 10 to 25 percent shorter than base region 520. In an embodiment the length Ls of trench source electrode 540 is longer by extending approximately half way through the length Ln− of N− layer 530. In an embodiment Ls of electrode 540 is longer by approximately one quarter way through the length Ln of N layer 530.

The term "approximately" used above means plus or minus 25% of the stated value.

A source electrode is formed at the top surface of the substrate, with pockets of silicon oxide placed on the top area across the width Wt of each trench. Thus this source electrode extends over the entire top surface of the substrate with the three trenches, contacts the silicon oxide on top of each trench and contacts the top surface of the substrate elsewhere.

In an embodiment N+ source regions are formed within a top layer of the P− base region 520 as shown. The source electrode serves as a metal source pad and provides an external connection to the source regions and of trench source electrode 540. A source pad is insulated from the gate electrode and source electrode by silicon oxide. When a positive voltage is applied to gate electrodes 550, the MOSFET device turns ON and a conducting channel is formed vertically along the trench walls within base region 520 between the trench source electrode 540 and the N− layer 530, also called the drift/epitaxial region.

A MOSFET is made up of many cells, and the more cells that are placed in parallel the lower the Rds (drain-to-source resistance in the ON state). This fact establishes the relationship between the ON resistance and the MOSFET's area, or die size as it is commonly called. The current-conduction-paths in the MOS device described are vertical paths, through the epitaxial layer and the substrate. The current channels are aligned generally parallel to the trenches. The vertical current paths in the trench design inherently are more efficient at packing more cells together in a small space such as a fixed die size than planar structures. The current flows associated with each trench are combined and outputted at drain electrode at the bottom of the figure.

In a most desirable embodiment depletion layers that form at the bottom of the trenches expand uniformly. In an embodiment the definition of "expand uniformly" means that the depletion layer depth continues to expand (deepen) with increasing voltage to the same extent with increasing voltage (with plus/minus 50% deviation, and more preferably plus/minus 25% deviation).

In an embodiment a MOSFET made with the structural and chemical considerations outlined herein can withstand at least 100, 150, 200, 240 or even more volts between source and drain. Because of this structure, MOSFETs can be made having a higher voltage performance and in embodiments have high voltage capability to replace IGBTs in high voltage applications.

In a preferred embodiment, peripheral trenches are not present. In a preferred embodiment, instead, such complicated additional structures are avoided for achieving high voltage performance by a structural and optionally a chemical feature. Desirably, defined trench widths 225 and intervals 230 (shown in FIG. 5) are adjusted to a ratio that was unexpectedly found to provide more even displacement zones during use. Preferably this ratio is between 1.0 and 2.5, particularly for the use of silicon based semiconductors. Other semiconductor materials can be used within this ratio and even other ratios, based on this disclosure, and are intended.

In an embodiment the trench sides are lined with a dielectric layer, an insulator layer or no layer and the bottom of the trench is lined similarly. In an embodiment the width w1 of first and second gates 550 is preferably 0.001-10 microns. In an embodiment the width w1 is between 0.002 and 0.22 microns. In an embodiment the length is 0.5-100 microns. In another embodiment the length is between 1.0 and 10 microns. Desirably a channel is formed in a body region adjacent a wall of the trench. The two gates are biased positively in an enhancement-mode N-channel device, and are biased negatively in an enhancement-mode P-channel device. When the gates are properly biased the channel becomes inverted and allows current to flow between the source and the drain.

Other Embodiments for Optional Combination

An embodiment provides a vertical FPMOS having high voltage resistance without peripheral trench structure, comprising a semiconductor substrate with an epitaxial layer, parallel trenches of defined widths at defined intervals across a top portion of the semiconductor substrate extending laterally across the substrate and extending into the epitaxial layer wherein the defined trench widths and the defined intervals between trenches are at a ratio of 1.0 to 2.5 respectively; base regions located outside and near the tops of the trenches; source electrodes inside the trenches; and gate electrodes inside the trenches positioned between the source electrodes and the base regions, wherein the location and doping of base and epitaxial regions are arranged to provide uniform expansion of the depletion layer, thereby providing high voltage resistance. In an embodiment the vertical FPMOS has a base dopant concentration between 5×10E16 to 5×10E17 per cubic centimeter. In an embodiment the N-epitaxial layer has a dopant concentration of between 1.2E16 to 1.8E16 per cubic centimeter.

In a desirable embodiment the vertical FPMOS lacks a peripheral trench structure. In an embodiment the source electrodes are centered in the trenches, and extend at least mostly to the bottom of the trenches. In an embodiment the gate electrodes are between the source electrodes and the trench walls, and extend only partially into the trenches adjacent the base regions. In an embodiment the trench widths are approximately 1.5 microns. In an embodiment the trench widths are between 1.3 and 1.7 microns. In an embodiment the spacing between trenches is approximately 1.7 microns. In an embodiment the spacing between trenches is between 1.5 and 1.9 microns. Other embodiments are intended as will be apparent to a skilled reader of this specification and of further details in the cited art therein which is already of record in the patent office.

Embodiments described herein are exemplary only. Other embodiments will be readily apprehended by a skilled artisan reader having a degree in solid state physics and two years experience working in development of MOSFET devices. Space and time limitations preclude further description herein. Details such as numeric dimensions, angles, positioning, relative and actual dimensions, materials and methods relating to physical and structural construction of MOSFET devices described in the cited references are specifically incorporated by reference herein and are intended as possible claimed features. The term "approximately" unless other specified means up to plus or minus 25% of the stated value.

I claim:

1. A semiconductor power device disposed in a semiconductor substrate, comprising:
   trenches having defined widths formed at defined intervals perpendicular to and across a top portion of the semiconductor substrate extending laterally across the substrate and extending into an epitaxial layer;
   base regions located outside the trenches;
   long trench source electrodes inside the trenches; and
   shorter gate electrodes inside the trenches positioned between the trench source electrodes and the base regions and generally parallel to the trench source electrodes, with an effective capacitance along their length from top region near the surface to bottom region towards the trench bottom, wherein
   the distance between the trench source electrode surfaces and the gate electrode surfaces is larger at the top region than that at the bottom region.

2. The semiconductor power device of claim 1, wherein the distance between the trench source electrode surfaces and the gate electrode surfaces decreases from the top region to the bottom region respectively.

3. The semiconductor power device of claim 1, wherein the trench gate electrodes are angled in towards the trench center with increasing depth in the trench.

4. The semiconductor power device of claim 1, wherein the trench source electrode is thicker at a deeper region below the gate electrodes.

5. The semiconductor power device of claim 3, wherein the thicker region of the source electrode starts at a depth that is below the gate electrode by a distance equal to at least half of the gate electrode thickness.

6. The semiconductor power device of claim 1, wherein the thickness of the trench source electrode parallel to the gate electrodes increases with increasing depth in the trench region at the location of the gate electrodes.

7. The semiconductor device of claim 1, wherein the thickness of the trench source electrode parallel to the gate electrodes increases with increasing depth in the trench region at the location of the gate electrodes and the gate electrode surfaces protrude closer to the center of the trench with increasing depth in the trench.

8. The semiconductor power device of claim 1, wherein the base dopant concentration is between 5×10E16 to 5×10E17 per cubic centimeter.

9. The semiconductor power device of claim 1, wherein the epitaxial layer has a dopant concentration of between 1.2E16 to 1.8E16 N– per cubic centimeter.

10. The semiconductor power device of claim 3, wherein the epitaxial layer has a dopant concentration of between 1.2E16 to 1.8E16 N– per cubic centimeter.

11. The semiconductor power device of claim 1, lacking a peripheral trench structure.

12. The semiconductor power device of claim 1, wherein the trench source electrodes are centered in the trenches, and extend at least mostly to the bottom of the trenches.

13. The semiconductor power device of claim 1, wherein the gate electrodes are between the trench source electrodes and the trench walls, and extend only partially into the trenches adjacent the base regions.

14. The semiconductor power device of claim 13, wherein the base regions are at the top of the epitaxial layer and extend down as far as the gate electrodes.

15. The semiconductor power device of claim 1, wherein the trench widths are approximately 1.5 microns.

16. The semiconductor power device of claim 10, wherein the spacing between trenches is approximately 1.7 microns.

17. The semiconductor power device of claim 1, having depletion regions along the trenches that expand uniformly with applied voltage.

18. A vertical FPMOS having high voltage resistance without peripheral trench structure, comprising:
    a semiconductor substrate with an epitaxial layer,
    parallel trenches of defined widths at defined intervals across a top portion of the semiconductor substrate extending laterally across the substrate and extending into the epitaxial layer wherein the defined trench widths and the defined intervals between trenches are at a ratio of 1.0 to 2.5 respectively;
    base regions located outside and near the tops of the trenches;
    source electrodes inside the trenches; and
    gate electrodes inside the trenches positioned between the source electrodes and the base regions, wherein
    the location and doping of base and epitaxial regions are arranged to provide uniform expansion of the depletion layer, thereby providing high voltage resistance, and
    wherein the trench source electrode and trench gate electrode surfaces are positioned closer to each other at increasing depth in the trench.

19. The vertical FPMOS of claim 18, wherein the base dopant concentration is between 5×10E16 to 5×10E17 per cubic centimeter and wherein the N-epitaxial layer has a dopant concentration of between 1.2E16 to 1.8E16 per cubic centimeter.

20. The vertical FPMOS of claim 18, lacking a peripheral trench structure.

* * * * *